US006689659B2

United States Patent
Kang et al.

(10) Patent No.: US 6,689,659 B2
(45) Date of Patent: Feb. 10, 2004

(54) METHOD OF MAKING SEMICONDUCTOR MEMORY DEVICE HAVING A FLOATING GATE WITH A ROUNDED EDGE

(75) Inventors: Man-Sug Kang, Gyeonggi-do (KR); Hyoung-Jo Huh, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/144,726

(22) Filed: May 15, 2002

(65) Prior Publication Data

US 2002/0179960 A1 Dec. 5, 2002

(30) Foreign Application Priority Data

May 29, 2001 (KR) ........................................ 2001-29753

(51) Int. Cl.[7] ......................................... H01L 21/8242
(52) U.S. Cl. ..................... 438/260; 438/261; 438/978
(58) Field of Search ................................ 438/260, 261, 438/263, 264, 265, 978

(56) References Cited

U.S. PATENT DOCUMENTS 5,830,771 A    11/1998  Fukatsu et al. ............. 438/257
5,836,772 A *  11/1998  Chang et al. ................ 438/261
6,284,598 B1 *  9/2001  Kelley et al. ................ 438/261
6,387,756 B1 *  5/2002  Muramatsu ................. 438/261

FOREIGN PATENT DOCUMENTS

JP    07-058221    3/1995
JP    08-083854    11/1998

* cited by examiner

*Primary Examiner*—Chandra Chaudhari
(74) *Attorney, Agent, or Firm*—Harness, Dickey & Pierce, P.L.C.

(57) ABSTRACT

A semiconductor memory device having a floating gate and a method of manufacturing the same, where a conductive layer for a floating gate is deposited on a semiconductor substrate and etched to form a conductive layer pattern. An annealing of the semiconductor substrate is carried out in an ambient atmosphere of hydrogen gas. Alternatively, an entire surface of the conductive layer pattern is etched by a dry etching method or a wet etching method. As a result, at least one edge of the conductive layer pattern is rounded, which reduces the likelihood that an electric field is concentrated at the edge and reduces a likelihood that the dielectric layer formed on the floating gate is thinner at the edge.

16 Claims, 5 Drawing Sheets

METHOD OF MAKING SEMICONDUCTOR MEMORY DEVICE HAVING A FLOATING GATE WITH A ROUNDED EDGE

BACKGROUND OF THE INVENTION

1. Field of the Invention

The present invention relates to a semiconductor memory device and a method of manufacturing the same. More particularly, the present invention relates to a floating gate of a semiconductor memory device and a method of forming the same.

2. Description of the Related Art

Semiconductor memory devices are generally of two types, a random access memory (RAM), such as a dynamic random access memory (DRAM) or a static random access memory (SRAM), which may be referred to as a volatile memory device in which the stored data on the cell is destroyed if power is interrupted and a read only memory (ROM), which may be referred to as a non-volatile memory device in which the stored data on the cell is retained even when the power is temporarily interrupted.

Since the non-volatile memory device has a capability of storing data for an unlimited time, there is an increased demand for a flash memory device such as electrically erasable and programmable ROM (EEPROM) capable of inputting and outputting data electrically. Memory cells of these memory devices may have a vertically laminated gate structure including a floating gate formed on a silicon substrate. Memory cells having a multi-layered gate structure typically include at least one tunnel oxide layer or dielectric layer and a control gate formed on or adjacent to the floating gate. In a flash memory cell having the above structure, storing the data is accomplished as an acceptable voltage is applied to the control gate and the substrate to introduce or extract electrons in/from the floating gate. A dielectric layer maintains the electric potential on the floating gate.

FIGS. 1A and 1B are sectional views of the flash memory cell according to the conventional art, in which FIG. 1A is a sectional view of the flash memory cell, taken along a bit line and FIG. 1B is a sectional view of the flash memory cell, taken along a word line.

Referring to FIGS. 1A and 1B, a tunnel oxide layer 12 is formed on a semiconductor substrate 10 in which a field region 11 is formed. A floating gate 14 is formed on tunnel oxide layer 12. A dielectric layer 16 is formed on the floating gate 14 and a control gate 20 is formed on the floating gate 14.

The floating gate 14 is formed on an active region and extended to portions of the field region 11 on both sides of the active region 11. The control gate 20 is provided as a word line and has a polycide structure in which a doped poly-silicon layer 18 and a metal silicide layer 19 are laminated in order to lower a resistance value thereof.

Since a high coupling ratio should be maintained between the floating gate 14 and the control gate 20 in order to induce a voltage applied to the control gate 20 to the floating gate 14, a thickness of the dielectric layer 16 should be small to increase a capacity thereof. Furthermore, the dielectric layer 16 should have an electric charge retention characteristic such that electric charge is not leaked from the charged floating gate 14.

It is fairly difficult to form a thin thermal oxide film on the floating gate 14 including doped poly-silicon because of the increase in leakage current. As a result, a composite layer including a first oxide layer, a nitride layer and a second oxide layer of which dielectric constant is higher than a single oxide layer is currently used as the dielectric layer 16. After growing the first oxide layer by a thermal oxidation process, the nitride layer is deposited on the first oxide layer by a low-pressure chemical vapor deposition (LPCVD) method. Then, the second oxide layer is grown on the nitride layer by the thermal oxidation process.

Because an edge of the floating gate 14 is sharp, a thickness of the dielectric layer 16 is smaller at the edge of the floating gate 14 when the dielectric layer 16 is formed (illustrated at circle "A" in FIG. 1B). Therefore, an electric field is concentrated at the edge of the floating gate 14 which increases the leakage current. This causes endurance and data retention characteristics of the memory cell to be deteriorated.

These problems may occur even though the dielectric layer 16 is formed by a chemical vapor deposition (CVD) method in order to reduce the thickness of the dielectric layer 16 thinner, instead of a thermal oxidation process.

SUMMARY OF THE INVENTION

The present invention provides a non-volatile memory device in which an edge of a floating gate is rounded.

The present invention also provides a method of manufacturing a non-volatile memory device in which an edge of a floating gate is rounded to reduce the deterioration of endurance and data retention characteristics.

The present invention provides a semiconductor memory device including a substrate having a defined active region, an insulation layer formed on the active region of the substrate, and a floating gate formed on the insulation layer, with at least one rounded edge.

The present invention also provides a method of manufacturing a semiconductor memory device including forming a field oxide layer on a semiconductor substrate to divide the semiconductor substrate into a active region and a field region; forming a tunnel oxide layer on the semiconductor substrate, depositing a conductive layer for forming a floating gate on the tunnel oxide layer, partially etching the conductive layer on the field region to form a conductive layer pattern, and rounding at lest one edge of the conductive layer pattern.

In the present invention, an annealing of the semiconductor substrate may carried out in an ambient atmosphere of hydrogen gas after the conductive layer for the floating gate is patterned. Alternatively, an entire surface of the conductive layer may be etched by dry or wet etching, to thereby round at least one edge of the conductive layer pattern. As a result, the dielectric layer, which is formed on the floating gate, is not thinner at an edge of the floating gate.

BRIEF DESCRIPTION OF THE DRAWINGS

The present invention will become readily apparent by reference to the following detailed description when considered in conjunction with the accompanying drawings wherein.

DETAILED DESCRIPTION OF THE PREFERRED EMBODIMENT

Hereinafter, exemplary embodiments of the present invention will be described in detail with reference to the accompanying drawings.

Figure 1A:
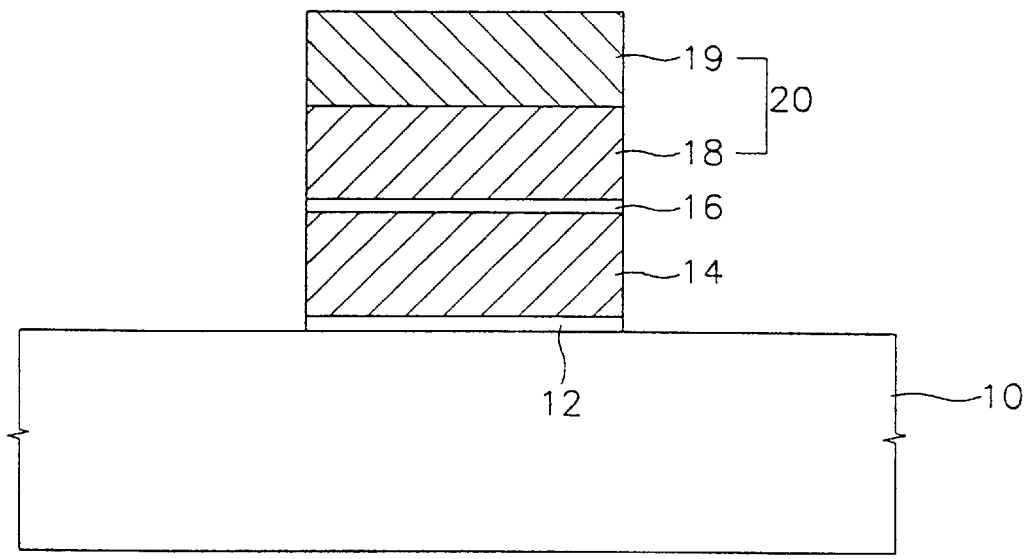
FIGS. 1A and 1B are sectional views of showing a construction of a flash memory cell according to the conventional art.
Figure 1B:
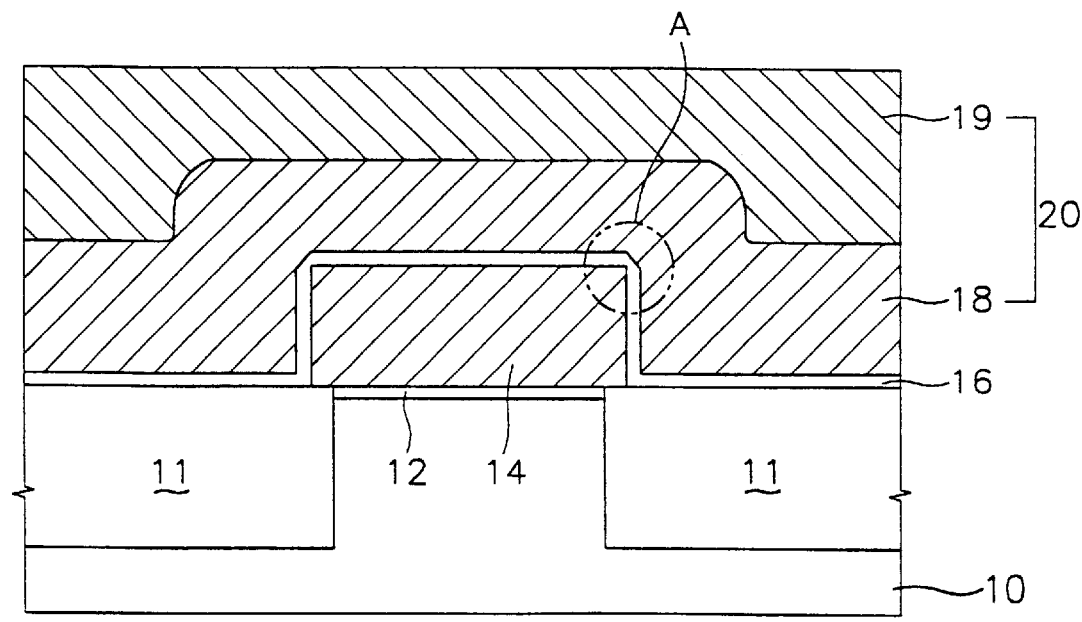
Figure 2:
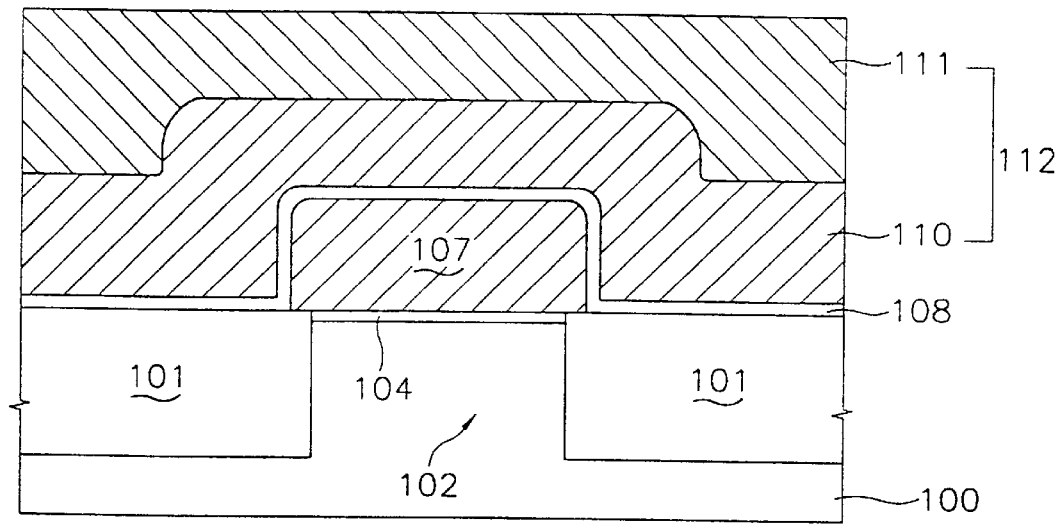
FIG. 2 is a sectional view of a flash memory cell according to at least one embodiment of the present invention.

FIG. 2 is a sectional view of a flash memory cell according to at least one embodiment of the present invention.

Referring to FIG. 2, an active region 102 in which a source and a drain of the memory cell transistor are formed is divided by a field region 101 to extend in a first direction while being in parallel or substantially in parallel with the field region 101. A plurality of word lines are spaced apart from one another on the active region 102 to extend in a second direction perpendicular or substantially perpendicular to the active region 102.

The memory cell transistor has a stacked gate structure in which a floating gate 107 is formed on a semiconductor substrate 100 with a tunnel oxide layer 104 (that is, a gate oxide layer) interposed therebetween, and a control gate 112 is formed on the floating gate 107 with a dielectric layer 108 interposed therebetween.

The floating gate 107 is typically comprised of doped polysilicon, which is formed on the active region 102 and extended on portions of the field region 101 formed on both sides of the active region 102. The floating gate 107 is formed so that an edge thereof is rounded. Accordingly, the dielectric layer 108 formed on the floating gate 107 has a uniform or substantially uniform thickness. As a result, the dielectric layer 108 is not thinner at an edge of the floating gate 107.

The control gate 112 provided as the word line has a polycide structure in which the doped poly-silicon layer 110 and a metal silicide layer 111 are stacked.

FIGS. 3A to 3F are sectional views of illustrating a process of manufacturing the flash memory cell according to at least one embodiment of the present invention.

Figure 3A:
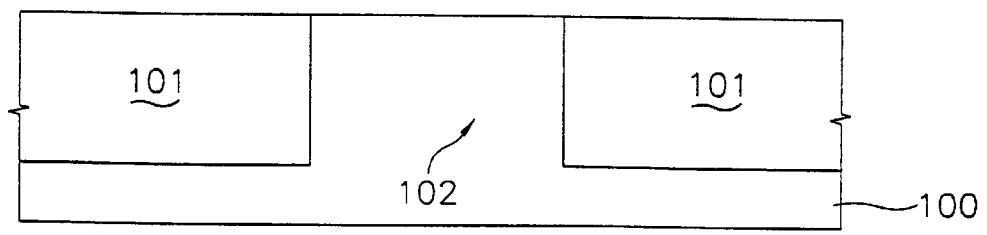
FIGS. 3A to 3F are sectional views illustrating a process of manufacturing the flash memory cell according to at least one embodiment of the present invention.

Referring to FIG. 3A, a field region 101 is formed on a semiconductor substrate 100 by a shallow trench isolation process, to thereby define an active region 102 on the substrate 100. More particularly, the substrate 100 may be etched at a desired depth to form a trench and then an oxide film may be deposited on the substrate 100 by the chemical vapor deposition (CVD) process to fill the trench. Next, the CVD-oxide film may be etched by an etch-back method or a chemical-mechanical polishing (CMP) method, to thereby form the field oxide film only in the trench.

The field region 101 may be formed by a local oxidation of silicon (LOCOS) method or by a self-aligned shallow trench isolation (SA-STI) method in which the active region and floating gate are formed simultaneously.

Figure 3B:
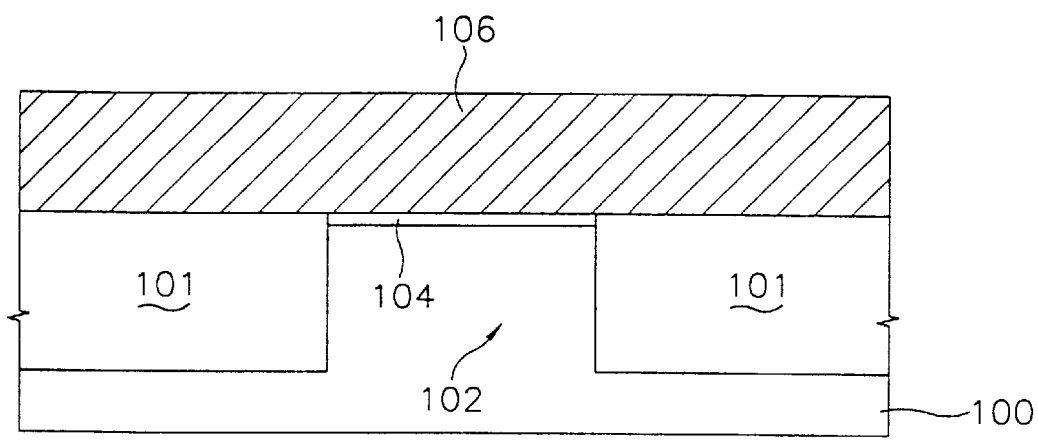

Referring to FIG. 3B, a tunnel oxide layer 104 (that is, the gate oxide layer) having a thickness of about 70~100 Å is formed in the active region 102. On the other hand, in order to form a gate oxide layer of a selected transistor and a gate oxide layer of a cell transistor which have a different thickness from each other, the tunnel oxide layer 104 may be formed on the substrate 100 after the gate oxide layer is grown on the substrate 100 and then only the gate oxide layer in the cell transistor region is removed away by a wet etching during a photolithography process.

Since at least one of characteristics of the flash memory device, data retention capability, depends on a reliability of the tunnel oxide film layer 104, a number of repeat operations of "programming" and "erasing" is limited. Typically, the operation of "programming" and "erasing" can be repeated more than one million times in order to use the flash memory device as a memory product.

Poly-silicon or amorphous silicon is deposited to a thickness of about 1000~1500 Å on the tunnel oxide layer 104 and doped with a high concentrated N-type dopant by a doping process, for example a diffusion of $POCL_3$, ion implanting, or in-situ doping, to form a conductive layer 106 which makes up the floating gate.

Figure 3C:
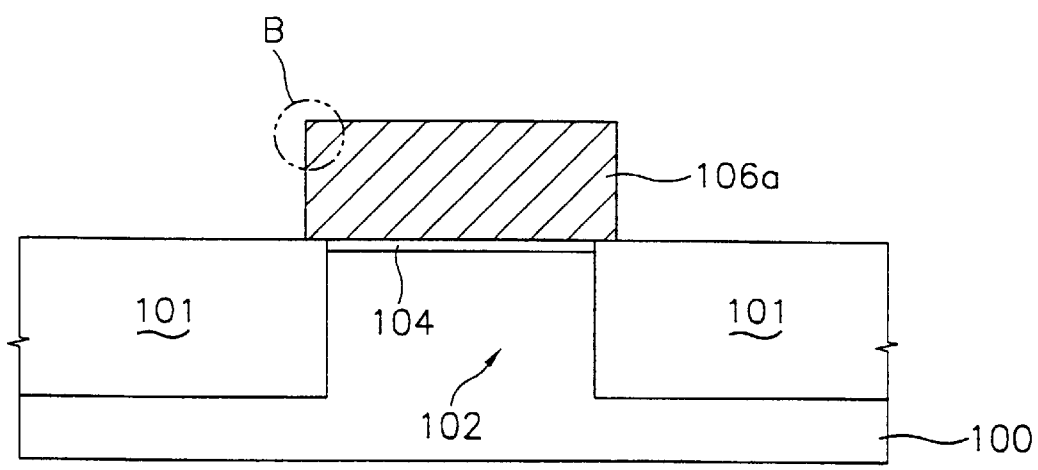

Referring to FIG. 3C, the conductive layer 106 on the field region 101 is partially removed by the photolithography process to thereby form a conductive layer pattern 106a. The floating gates of the memory cell adjacent to each other are separated along a bit line by the above process. At that time, the conductive layer pattern 106a has a sharp edge "B", as shown in FIG. 3C.

Figure 3D:
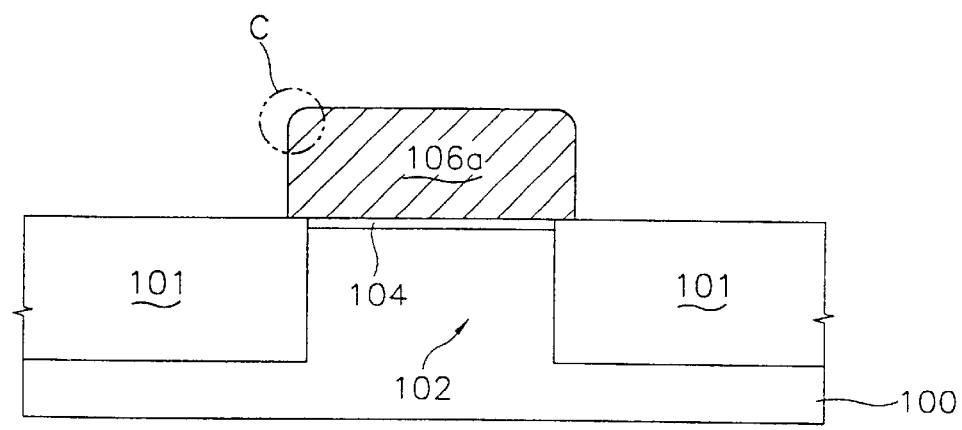

Referring to FIG. 3D, the substrate 100 is annealed in an ambient atmosphere of hydrogen gas so that the edge of the conductive layer pattern 106a is rounded. Preferably, the annealing of the substrate 100 is carried out under a pressure of no more than 20 Torr at a temperature of no more than 900° C. for one to three minutes.

When the annealing is performed as described above, silicon in the edge part of the conductive layer pattern 106a migrates to a side or an upper portion of the conductive layer pattern 106a. As a result, the edge of the conductive layer pattern 106a is rounded (see "C" in FIG. 3D).

Figure 3E:
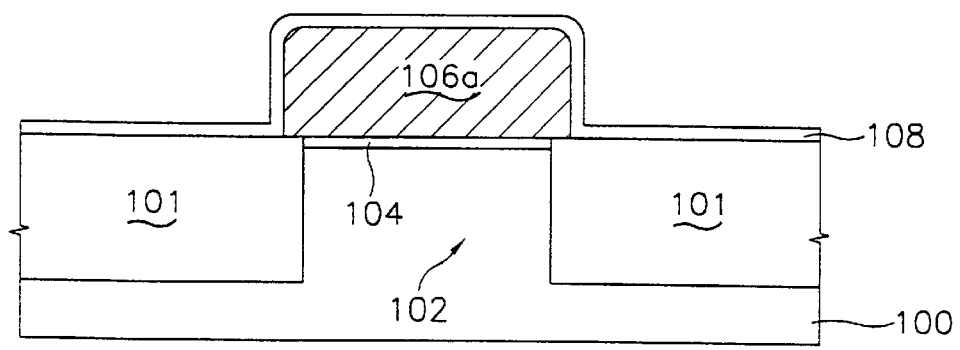

Referring to FIG. 3E, in order to insulate the floating gate and the control gate, a dielectric layer 108 including ONO may be formed on the substrate 100 and the conductive layer pattern 106a having the rounded edge. The dielectric layer 108 may be formed by a thermal oxidation process, or more preferably, a chemical vapor deposition method.

Particularly, a first oxide film is formed to a thickness of about 20~80 Å at a temperature of about 700~800° C. on the substrate 100 and the conductive layer pattern 106a is formed by chemical vapor deposition, preferably by a low pressure chemical vapor deposition (LPCVD) method. Then, a first annealing is performed under an NO or $N_2O$ gas ambient to densify the first oxide film.

After a nitride film is deposited to the thickness of about 20~100 Å on the first oxide film by the LPCVD method, a second oxide film 109 is deposited to the thickness of about 20~70 Å at the temperature of about 700~750° C. on the nitride film by the chemical vapor deposition, preferably by the LPCVD method. Then, a second annealing is carried out under an NO or $N_2O$ gas ambient to densify the second oxide film. As a result, the dielectric layer 108 including LPCVD-ONO is formed.

Typically, since the LPCVD process is performed at a lower pressure (of no more than 250 Pa so as to increase a diffusivity of a molecular of reaction gas), it is possible to obtain the film having superior uniformity and conformal step coverage. When the LPCVD-oxide film is deposited under a temperature of about 700~780° C. and pressure of 10~100 Pa, it is possible to control the thickness of the oxide film and produce a thinner oxide film due to a low deposition rate under low pressure. Accordingly, when the dielectric layer 108 is formed on the conductive layer pattern 106a having the rounded edge by the LPCVD method, the part of the dielectric layer 108 at the edge of the conductive layer pattern 106a is not thinner than the rest of the dielectric layer 108.

Figure 3F:
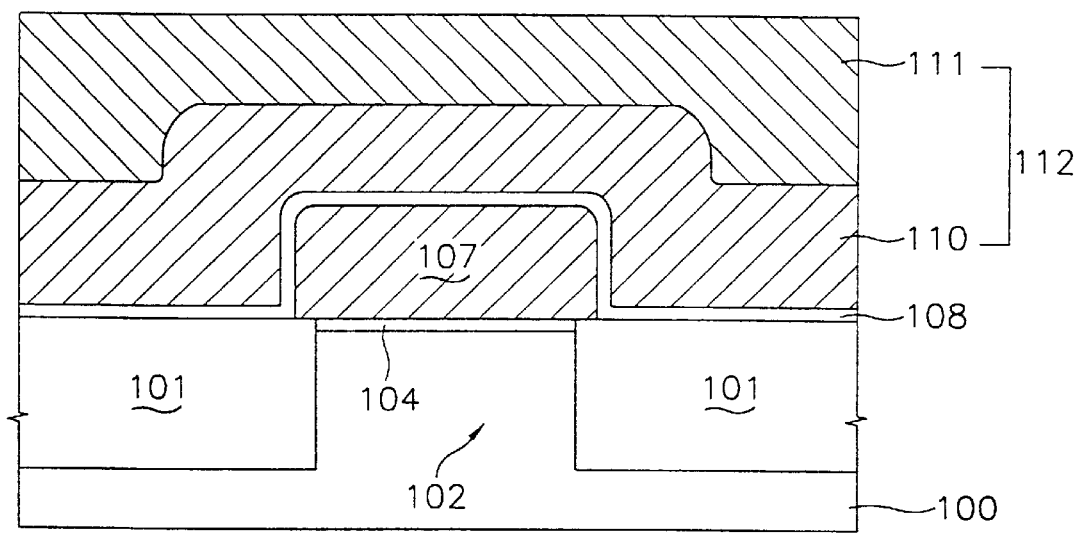

Referring to FIG. 3F, an $N^+$-doped poly-silicon layer 110 and a metal silicide layer such as tungsten silicide ($WSi_x$), titanium silicide ($TiSi_x$) and tantalum silicide ($TaSi_x$) are sequentially stacked on the dielectric layer 108. Preferably, the poly-silicon layer 110 has a thickness of about 1000 Å and the metal silicide layer 111 has a thickness of about 100–1500 Å.

Next, the metal silicide layer 111 and the poly-silicon layer 110 are patterned by a photolithography process to form a control gate 112 and then, the exposed dielectric layer 108 and the conductive layer pattern 106a are patterned, in a unit of a cell, by the dry etching process to form a floating gate 107.

According to another exemplary embodiment of the present invention, after the conductive layer pattern 106a of FIG. 3C is formed in the same manner as described with respect to the first embodiment of the present invention, an entire surface of the resultant structure is etched by an reactive ion etching (RIE) using dry etching equipment. As ions are concentrated at the sharp corner "B" of the conductive layer pattern 106a due to a sputtering characteristic, the sharp corner "B" is subjected to erosion. As a result, the edge of the conductive layer pattern 106a is rounded. The dry etching process described above may be carried out by using fluorine gas (F), chlorine gas (Cl), bromine gas (Br), a mixture thereof, etc. which has an etching amount of a silicon film greater than an oxide film. Preferably, the above dry etching amount of the silicon film is no more than 300 Å.

According to a still another exemplary embodiment of the present invention, after the conductive layer pattern 106a of FIG. 3C is formed in the same manner as described with respect to the first embodiment of the present invention, an entire surface of the resultant structure is etched by a wet etching process. As the edge of the conductive layer pattern 106a is etched in a three dimensional direction due to the characteristic of the wet etching process, the edge of the conductive layer pattern 106 is etched to a greater degree in comparison with the upper portion or the side of the conductive layer pattern 106a. Accordingly, the edge of the conductive layer pattern 106a is rounded. The above wet etching process may be carried out by a chemical which has an etching amount of a silicon film greater than an oxide film. Preferably, the wet etching amount of the silicon film is no more than 100 Å.

According to the exemplary embodiments of the present invention as described above, after patterning the conductive layer for the floating gate, hydrogen (H2) annealing or etching by dry or wet etching is carried out so as to round the edge of the floating gate. Therefore, it is possible to reduce the electric field from being concentrated at an edge of the floating gate and also, it is possible to prevent the dielectric layer formed on the floating gate from becoming thinner at the edge of the floating gate. Accordingly, the deterioration of endurance and data retention characteristics of the memory cell can be reduced.

The present invention in which the edge of the floating gate is rounded can be applied to all semiconductor devices having the floating gate structure.

Although the exemplary embodiments of the present invention have been described, it is understood that the present invention should not be limited to these exemplary embodiments but various changes and modifications can be made by one skilled in the art within the spirit and scope of the present invention as hereinafter claimed.

What is claimed is:

1. A method of manufacturing a semiconductor memory comprising:

forming a field oxide layer on a semiconductor substrate to divide the semiconductor substrate into an active region and a field region;

forming a tunnel oxide layer on the semiconductor substrate;

depositing a conductive layer for forming a floating gate on the tunnel oxide layer;

partially etching the conductive layer on the field region to form a conductive layer pattern;

rounding at least one edge of the conductive layer pattern by dry etching an entire surface of the conductive layer pattern; and forming a dielectric layer on the substrate and the conductive layer pattern at a pressure of from approximately 10–100 Pa to form a dielectric layer having a substantially uniform thickness.

2. A method of manufacturing a semiconductor memory device as claimed in claim 1, wherein the dry etching of the entire surface of the conductive layer pattern is carried out by using at least one selected from the group consisting of fluorine gas (F), chlorine gas (Cl), bromine gas (Br) and a mixture thereof, which has an etching amount of a silicon film greater than an oxide film.

3. A method of manufacturing a semiconductor memory device as claimed in claim 1, wherein the dry etching of the entire surface of the conductive layer pattern is carried out so that an amount of etching the silicon film is no more than 300 Å.

4. A method of manufacturing a semiconductor memory device comprising:

forming a field oxide layer on a semiconductor substrate to divide the semiconductor substrate into an active region and a field region;

forming a tunnel oxide layer on the semiconductor substrate;

depositing a conductive layer for forming a floating gate on the tunnel oxide layer;

partially etching the conductive layer on the field region to form a conductive layer pattern;

rounding at least one edge of the conductive layer pattern by wet etching an entire surface of the conductive layer pattern; and forming a dielectric layer on the substrate and the conductive layer pattern at a pressure of from approximately 10–100 Pa to form a dielectric layer having a substantially uniform thickness.

5. A method of manufacturing a semiconductor memory device as claimed in claim 4, wherein the wet etching of the entire surface of the conductive layer pattern is carried out by using a chemical which has an etching amount of a silicon film greater than an oxide film.

6. A method of manufacturing a semiconductor memory device as claimed in claim 4, wherein the wet etching of the entire surface of the conductive layer pattern is carried out so that an etching amount of the silicon film is no more than 100 Å.

7. A method of manufacturing a semiconductor memory device as claimed in claim 1, further comprising:

depositing a control gate on the dielectric layer.

8. A method of manufacturing a semiconductor memory device as claimed in claim 7, wherein the dielectric layer is formed by a thermal oxidation method.

9. A method of manufacturing a semiconductor memory device as claimed in claim 7, wherein the dielectric layer is formed by a chemical vapor deposition method.

10. A method of manufacturing a semiconductor memory device as claimed in claim 1, wherein the conductive layer is formed by depositing at least one of poly-silicon or amorphous silicon.

11. A method of manufacturing a semiconductor memory device comprising:

forming a field oxide layer on a semiconductor substrate to divide the semiconductor substrate into an active region and a field region;

forming a tunnel oxide layer on the semiconductor substrate;

depositing a conductive layer for forming a floating gate on the tunnel oxide layer;

partially etching the conductive layer on the field region to form a conductive layer pattern; and dry etching an entire surface of the conductive layer pattern to round at least one edge of the conductive layer pattern.

12. A method of manufacturing a semiconductor memory device as claimed in claim 11, wherein the dry etching of the entire surface of the conductive layer pattern is carried out by using at least one selected from the group consisting of fluorine gas (F), chlorine gas (Cl), bromine gas (Br) and a mixture thereof, which has an etching amount of a silicon film greater than an oxide film.

13. A method of manufacturing a semiconductor memory device as claimed in claim 11, wherein the dry etching of the entire surface of the conductive layer pattern is carried out so that an amount of etching the silicon film is no more than 300 Å.

14. A method of manufacturing a semiconductor memory device comprising:

forming a field oxide layer on a semiconductor substrate to divide the semiconductor substrate into an active region and a field region;

forming a tunnel oxide layer on the semiconductor substrate;

depositing a conductive layer for forming a floating gate on the tunnel oxide layer;

partially etching the conductive layer on the field region to form a conductive layer pattern; and wet etching an entire surface of the conductive layer pattern to round at least one edge of the conductive layer pattern.

15. A method of manufacturing a semiconductor memory device as claimed in claim 14, wherein the wet etching of the entire surface of the conductive layer pattern is carried out by using a chemical which has an etching amount of a silicon film greater than an oxide film.

16. A method of manufacturing a semiconductor memory device as claimed in claim 14, wherein the wet etching of the entire surface of the conductive layer pattern is carried out so that an etching amount of the silicon film is no more than 100 Å.

* * * * *